United States Patent [19]
Foxcroft

[11] Patent Number: 5,818,855
[45] Date of Patent: Oct. 6, 1998

[54] GALOIS FIELD MULTIPLIER FOR REED-SOLOMON DECODER

[75] Inventor: Thomas Foxcroft, Bristol, United Kingdom

[73] Assignee: Discovision Associates, Irvine, Calif.

[21] Appl. No.: 801,544

[22] Filed: Feb. 18, 1997

[30]     Foreign Application Priority Data

Oct. 30, 1996 [GB]  United Kingdom ............... 9622539

[51] Int. Cl.$^6$ .................................................. H03M 13/00
[52] U.S. Cl. .................. 371/37.8; 371/37.12; 371/40.17
[58] Field of Search .................... 371/37.8, 40.17, 371/37.12, 42; 364/767, 770; 382/270, 298; 327/77; 375/232

[56]              References Cited

U.S. PATENT DOCUMENTS

| | | | |
|---|---|---|---|
| 3,872,430 | 3/1975 | Boudreau et al. ................. | 340/146.1 |
| 4,162,480 | 7/1979 | Berlekamp ............................ | 340/146.1 |
| 4,559,625 | 12/1985 | Berlekamp et al. ......................... | 371/2 |
| 4,633,470 | 12/1986 | Welch et al. ............................... | 371/37 |
| 4,833,678 | 5/1989 | Cohen ........................................ | 371/37 |
| 5,465,261 | 11/1995 | Descheme ............................. | 371/39.1 |
| 5,500,874 | 3/1996 | Terrell ..................................... | 375/232 |
| 5,668,831 | 9/1997 | Claydon et al. ......................... | 375/232 |

OTHER PUBLICATIONS

Scott et al., "Architectures for Exponentiation in GF($2^{\wedge}m$)", IEEE, pp. 578–586, Apr. 1988.

Lay et al., "A Decision–Aided Adaptive Equalizer With Simplified Implentation" IEEE, pp. 13851389, 1988.

Jaffe et al., "Incoherent Coding Techniques And performance Characterization For Multibeam Sonal Systems", IEEE, pp. 2709–2712, 1988.

Jullien et al., "A Madulo Bit–Level Systoloc Compiler", IEEE, pp. 457–460, 1989.

European Telecommunciations Standards Institute "European Telecommunication Standard: Digital Broadcasting Systems for Television, Sound and Data Service; Framing Structure, Channel Coding and Modulation for Digital Television." Valbonne, France. May 1996, pp. 1–40.

Whitaker, Sterling R. John Canaris and Kelly B. Cameron. "Reed Solomon VLSI Codec for Advanced Television." IEEE Transactions on Circuits and Systems for Video Technology, vol. 1 No. 2, Jun. 1991. pp. 230–233.

Arambeploa, B. & S. Choomchuay. Algortihms and Architectures for Reed–Solomon Codes. The GEC Journal of Research vol 9, No. 3, 1992, pp. 172–184.

Berlekamp, Elwyn R. Algebraic Coding Theory. Laguna Hills, CA: Aegean Park Press, 1984, pp. 180–184.

George C. Clark, Jr & J.Bibb Cain. Error–Correction Coding for Digital Communications, New York: Plenum Press, 1981, pp. 191–195, 209–214.

Richard E. Blahut. Theory and Practice of Error Control Codes. Reading, Mass: Addison–Wesley Publishing Company, 1984, pp. 183–191.

*Primary Examiner*—Reba I. Elmore
*Assistant Examiner*—McDieunel Marc
*Attorney, Agent, or Firm*—Ronald J. Clark; Robert T. Braun; Arthur S. Bickel

[57]               ABSTRACT

A Reed-Solomon decoder includes an optimized Galois Field multiplication circuit. The circuit has a plurality of multipliers, connected in a linear chain, wherein a first multiplicand of the first multiplier is the magnitude A, and the second multiplicand is a constant. The circuit operates on a linear combination of alpha values that sum to $\alpha^j$, each multiplier in the chain generating a succeeding alpha value. A plurality of selectors enable the outputs of the multipliers according to the magnitude $\alpha^j$. An addition circuit, preferably realized as a logical network of XOR gates, is connected to the selectors for adding the enabled outputs of the multipliers to form the final product.

10 Claims, 8 Drawing Sheets r = RESET
s = SET
α(x) = x^(th) BIT OF α

GALOIS FIELD MULTIPLIER FOR REED-SOLOMON DECODER

BACKGROUND OF THE INVENTION

1. Field of the Invention

This invention relates to decoders of forward error correction codes. More particularly this invention relates to a structure for performing multiplicative operations in Galois field arithmetic during Reed-Solomon decoding.

2. Description of the Related Art

Reed-Solomon encoding is now well established as an error correction code to protect transmitted data in modern transmission of image and audio data by digital techniques. Various implementations have been disclosed. For example our application EP 96301869.2 discloses a very large scale integrated circuit ("VLSI") implementation of a Reed-Solomon decoder in a digital receiver.

A modern application of Reed-Solomon coding has been proposed in the European Telecommunications Standard DRAFT pr ETS 300 744 (May 1996), which utilizes coded orthogonal frequency division multiplexing ("COFDM"). The Standard specifies the framing structure, channel coding, and modulation for digital terrestrial television. It was developed to accommodate digital terrestrial television within the existing spectrum allocation for analog transmissions, yet provide adequate protection against high levels of co-channel interference and adjacent channel interference. The noted Standard requires an outer Reed-Solomon code concatenated with an inner punctured convolutional code. This is combined with bit-wise and symbol interleaving on an MPEG-2 transport stream format. An RS (204,188, t=8) code is specified as the outer code, having a code generator polynomial:

$$g(x)=(x+\lambda^0)(x+\lambda^1)(x+\lambda^2)\ldots(x+\lambda^{15}) \quad (1)$$

where $\lambda=02_{HEX}$. The field generator polynomial is:

$$p(x)=x^8+x^4+x^3+x^2+1 \quad (2)$$

The hardware implementation of the Galois field multipliers in known Reed-Solomon decoders requires considerable resources, and has not been readily adaptable to new technologies and new applications in a production environment.

SUMMARY OF THE INVENTION

It is a primary object of the present invention to provide improved error detection correction and correction circuitry that performs extensive multiplicative operations on digital data.

It is another object of the invention to provide an improved Galois field multiplier in a VLSI implementation by reducing hardware resources.

It is yet another object of the invention to provide a Reed-Solomon decoder that can be readily adapted to various VLSI circuitry for use in telecommunications and similar purposes.

These and other objects of the present invention are attained by a decoder for an electromagnetic signal that is encoded according to a BCH code, wherein the code is specified by a generator polynomial g(x), and has a primitive element $\alpha$. The decoder operates on a terms $x_i \alpha^j$, which are formed by Galois Field Multiplication. The decoder includes Galois Field multiplication circuits for forming a product A*B where "*" is the Galois Field multiplication operator. Each Galois Field multiplication circuit has a plurality of multipliers, wherein a first multiplicand is the magnitude A, and the second multiplicand is a constant $\alpha^k$. The multipliers are interconnected, preferably in a linear chain, the output of one multiplier being connected to a first input of another multiplier. A plurality of selectors enable the outputs of the multipliers. The selectors have select lines that are set according to a representation of a magnitude B. An addition circuit, preferably realized as a logical network of XOR gates, is connected to the selectors for adding the enabled outputs of the multipliers to form the final product A*B. The addition performed by the addition circuit is without carry.

According to an aspect of the invention the multipliers comprise constant coefficient multipliers.

According to another aspect of the invention there is a plurality of lines connected to the select lines, which are set according to the representation of the magnitude B.

The invention provides a decoder for an electromagnetic signal encoded according to a BCH code that is specified by a generator polynomial g(x) and has a primitive element $\alpha$, the decoder being of a type which operates on a term $x_i \alpha^j$, wherein the improvement has a Galois Field multiplier has a plurality of constant coefficient multipliers. An input of each constant coefficient multiplier is a first multiplicand A, and a second multiplicand of the constant coefficient multiplier is a constant $\alpha^k$, wherein an output of the constant coefficient multiplier is connected to the input of a succeeding constant coefficient multiplier. A plurality of bit lines carry a binary representation of a magnitude B that control a plurality of switches, each switch being connected to the output of a respective one of the constant coefficient multipliers. An addition circuit for performing modulo 2 addition is connected to the switches for summing the outputs of the constant coefficient multipliers, whereby the summed outputs are output as a binary representation of the magnitude A*B.

The invention provides a method of performing Reed-Solomon decoding, wherein $\alpha$ is a primitive element in a Reed-Solomon code. It is performed by providing a VLSI circuit which has a Reed-Solomon decoder therein, and performing Galois Field multiplication in the circuit to obtain a product $x_i \alpha^j$ by the steps of (1) identifying a linear combination of values $\alpha^n$ which have a sum equal to $\alpha^j$, where for each value $\alpha^n$, n is an integer; (2) generating each value $\alpha^n$ by multiplying $\alpha^n$ by $\alpha^{n-k}$, where k is an integer; (3) multiplying each value $\alpha^n$ by $x_i$, to yield products $\alpha^n x_i$, and (4) summing the products $\alpha^n x_i$ to yield the value $x_i \alpha^j$.

BRIEF DESCRIPTION OF THE DRAWING

For a better understanding of these and other objects of the present invention, reference is made to the detailed description of the invention, by way of example, which is to be read in conjunction with the following drawings, wherein.

DESCRIPTION OF THE PREFERRED EMBODIMENT

Figure 1:
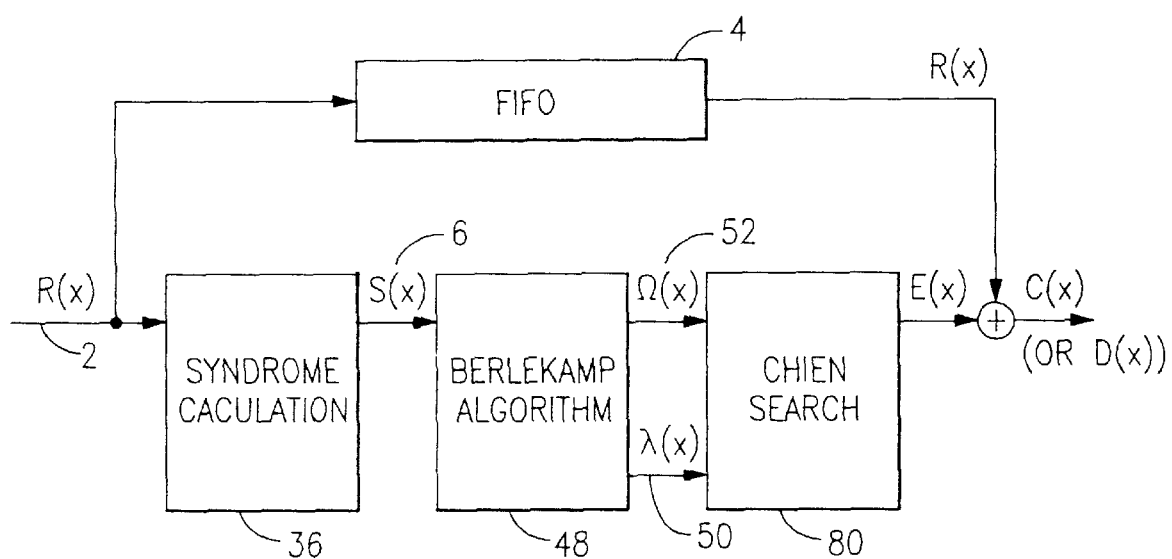
FIG. 1 is a functional block diagram of the Reed-Solomon decoder.

The approach to Reed-Solomon decoding is initially explained with reference to FIGS. 1 and 2. The invention can be practiced with this decoder, and with other Reed-Solomon decoders which employ Galois Field arithmetic. A 208 byte packet R(x)2 is input into a FIFO 4, which is realized as a RAM capable of storing 448 bytes. The FIFO 4 simply acts as a delay while the decoding proceeds. Only the 188 information bytes are required to be stored. The 20 parity bytes may be discarded as they are not employed after calculation of the syndromes S(x)6. The decoder 8 receives deinterleaved data in the packet R(x)2. A VALID flag 10 indicates that the current byte of the packet R(x)2 is a valid byte in the current packet. The end-of-packet flag EOP 12 is raised at the same time as the Valid flag 10 that the last byte of a packet has been received. An error flag OS 14 is raised in the event that a packet was prematurely terminated by the deinterleaver. This results in a resetting operation for the entire decoder. Bus CORRECT 16 contains corrected data. Line RS-VALID 18 indicates that data is on the bus CORRECT 16. This line is only raised when data bytes are on the line. Line RS_EOP 20 is a line indicating that the end of a packet has been detected. The line PACK_ERR 22 goes high when line RS_EOP 20 is raised. It indicates that the decoder 8 has been unable to correct a previously released packet. The Line RS_OS 24 signifies that a significant error condition has occurred within the packet. This signal is propagated through the system, and indicates that the current block will not provide any more valid data.

Figure 4:
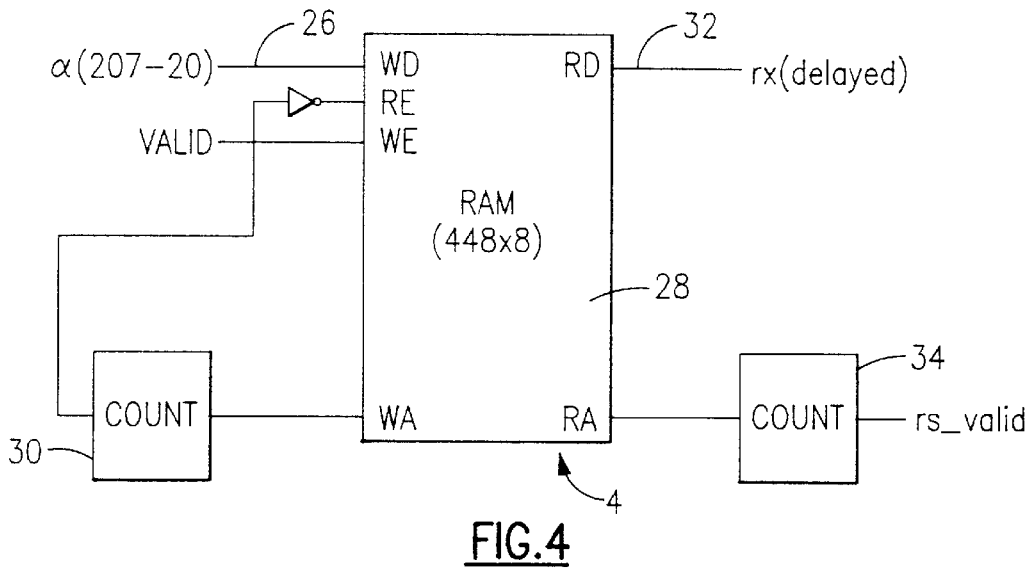
FIG. 4 is a block diagram of a FIFO that is incorporated in the decoder illustrated in FIG. 1.

Referring to FIG. 4, The first 188 bytes of the packet R(x)2 appear on line WD 26 of the FIFO 4, and are written into an address of RAM 28 according to the state of counter 30. Similarly a delayed version of the packet R(x)2 is read on line RD 32 from addresses selected according to the state of counter 34.

Syndromes are calculated in syndrome calculation block 36 (FIG. 1) according to the following equation.

$$S_j = \sum_{i=0}^{n-1} rx_i \, \alpha^{i(j+m_0)} \qquad (3)$$

wherein $S_j$ is the jth syndrome;

n is the number of bytes in a packet;

$m_0$ is an arbitrary integer (which equals zero);

$rx_i$ is the ith byte in a packet; and $\alpha^x$ is the xth $\alpha$ in a Galois Field.

Figure 5:
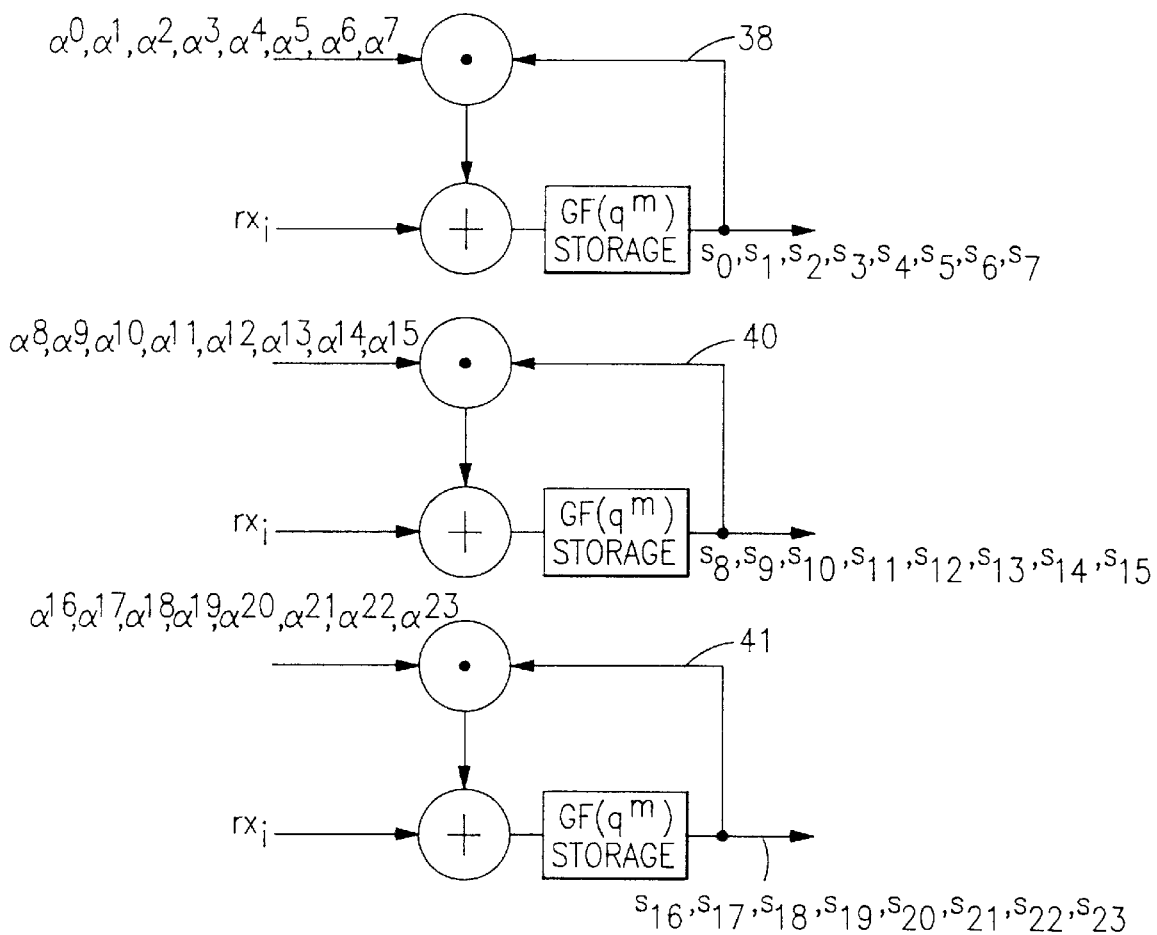
FIG. 5 shows a tapped feedback shift register for generating syndromes in the decoder illustrated in FIG. 1.

Referring now to FIGS. 1–7, the syndrome is generated by a bank of three units 38, 40, 41 operating in parallel (FIG. 5). The Galois Field entries $\alpha^i$ are produced by a tapped feedback shift register 42 (FIG. 3), comprising a plurality of flip-flops 44 having adders 46, the positions of which are determined by the generator polynomial given above. While 24 syndromes are determined for convenience, only the syndromes $S_0$–$S_{19}$ are actually used by the rest of the decoder 8.

Figure 6:
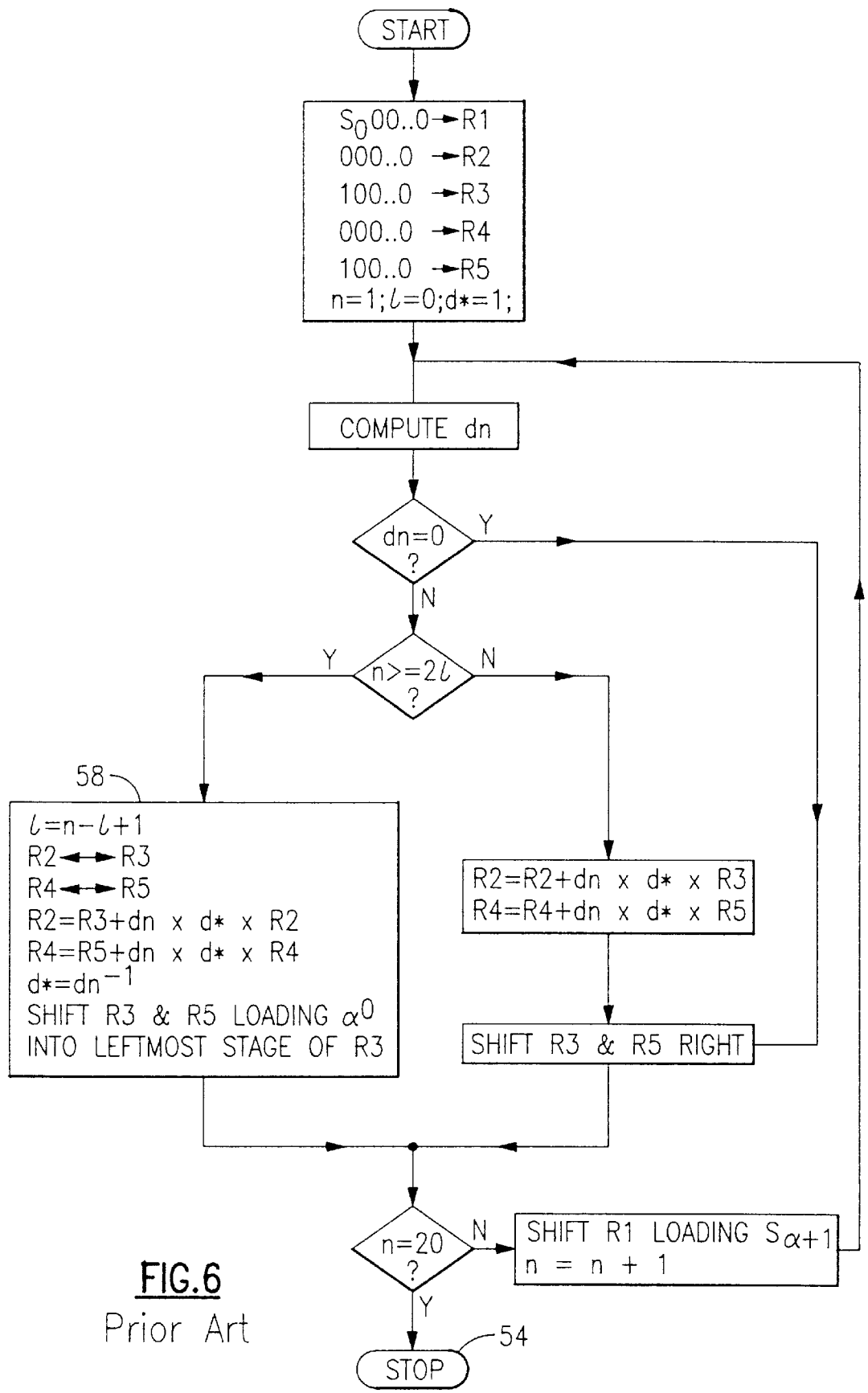
FIG. 6 shows a flow diagram of the Berlekamp algorithm used in a Reed-Solomon decoder in the prior art.

The Berlekamp algorithm executed in block 48 (FIG. 1) is a known method used to derive the locator polynomial, $\Lambda(x)50$, and the evaluator polynomial, $\Omega(x)52$. Its flow diagram is shown in FIG. 6. The following notation is used:

R1 is the Shift Register containing Syndrome bytes produced by the previous Syndrome block;

R2 contains a locator polynomial, $\Lambda(x)$, with $\Lambda_0=1$;

R3 contains the D polynomial;

R4 contains an evaluator polynomial, $\Omega(x)$, with $\Omega_{10}=0$;

R5 is temporary storage for the A polynomial;

$d_n$ is delta;

I is the order of the polynomial in R1; and n is a counter.

Figure 7:
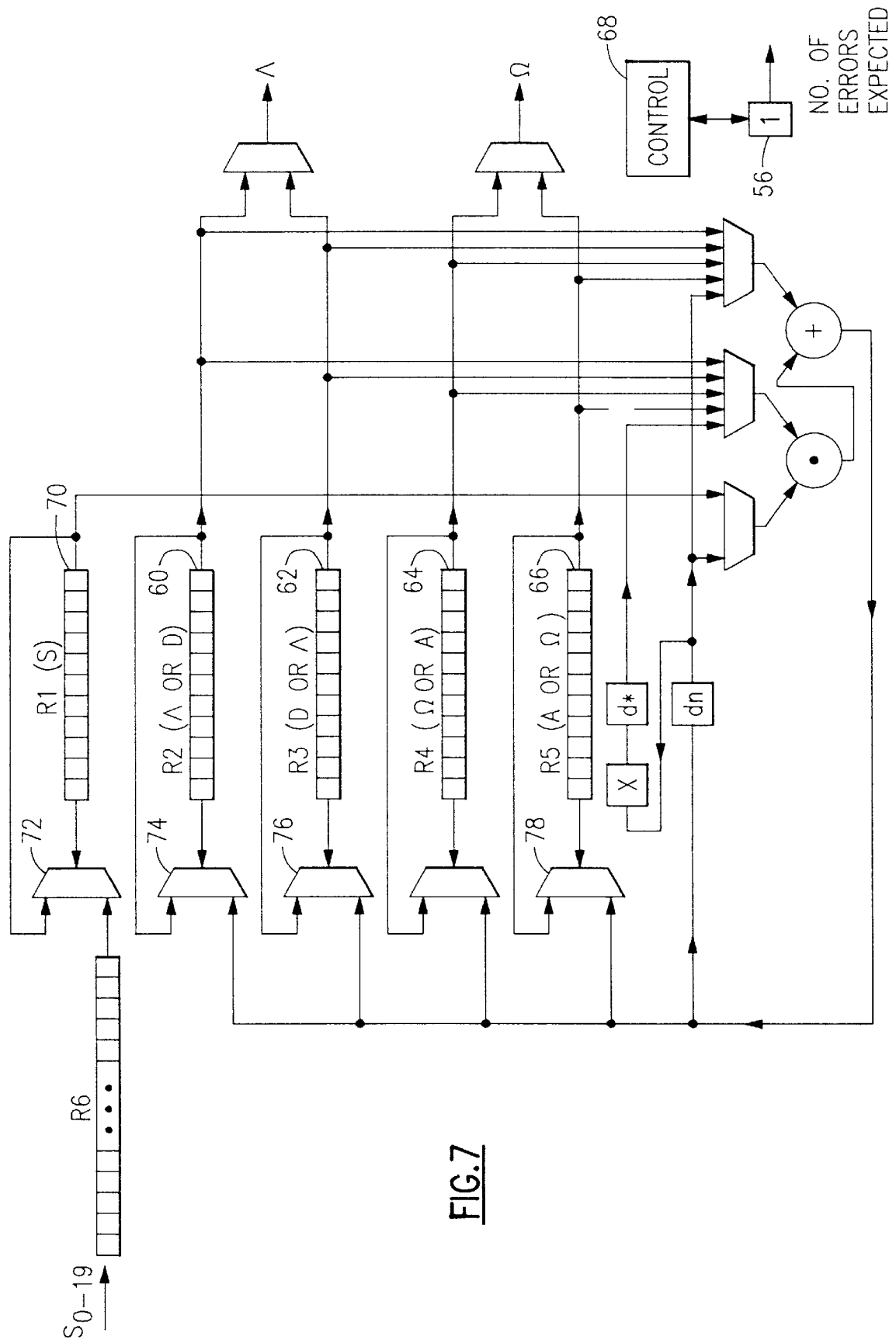
FIG. 7 shows a block diagram of an apparatus used to perform the Berlekamp algorithm used in the decoder illustrated in FIG. 1.

On STOP 54, I represents the number of errors found by the algorithm, and is maintained in register 56 (FIG. 7). In block 58, it is necessary to repetitively exchange the contents of registers R2 60 with register R3 62 for subsequent iterations of the algorithm.

The value $d_n$ is calculated according to the formula $$d_n = \sum_{i=0}^{10} \Lambda_{n,i} S_{n-i} \qquad (4)$$

The procedure performed in the apparatus shown in FIG. 7 differs from the algorithm in FIG. 6. Instead of exchanging the contents of register R2 60 with register R3 62, and exchanging the contents of register R4 64 with register R5 66, a toggle switch is used which register contains the respective polynomial. This approach is economical, as temporary storage is not required. Control block 68 is a 5 bit state machine, with decoding from each state determining (a) the next state; (b) enables of each of the shift registers 60–66 and 70; (c) the multiplexer selects for multiplexers 72, 74, 76, 78 to select input to registers 60–66, and register 70, corresponding to R1–R5 in block 58; (d) controlling the time during which each state is active; (e) recalculating the variables n and I as necessary; (f) and maintaining an indication of which registers contain $\Lambda(x)$ and $\Omega(x)$.

The Chien Search block 80 (FIG. 1) exhaustively evaluates every possible location to determine if it is a root of $\Lambda(x)$. Evaluation at a location is accomplished according to the equation $$\Lambda(\alpha^{-i}) = \sum_{k=0}^{10} \Lambda_k \, \alpha^{-ik} \qquad (5)$$

Although only 208 locations have been received, checking is done for all 255 possible locations, beginning at $x = \alpha^{254}$; for example $$\Lambda(\alpha^{-254}) = \Lambda(\alpha^1) = \Lambda_{10}(\alpha^{10})\text{'} + \text{'}\Lambda_9(\alpha^9)\text{'} + \text{'} \ldots \text{'} + \text{'}\Lambda_2(\alpha^2)\text{'} + \text{'}\Lambda_1(\alpha^1)\text{'} + \text{'}1 \qquad (6)$$

$$\Lambda(\alpha^{-253}) = \Lambda(\alpha^2) = \Lambda_{10}(\alpha^{20})\text{'} + \text{'}\Lambda_9(\alpha^{18})\text{'} + \text{'} \ldots \text{'} + \text{'}\Lambda_2(\alpha^4)\text{'} + \text{'}\Lambda_1(\alpha^2)\text{'} + \text{'}1 \qquad (7)$$

$$\Lambda(\alpha^{-252}) = \Lambda(\alpha^3) = \Lambda_{10}(\alpha^{30})\text{'} + \text{'}\Lambda_9(\alpha^{27})\text{'} + \text{'} \ldots \text{'} + \text{'}\Lambda_2(\alpha^6)\text{'} + \text{'}\Lambda_1(\alpha^3)\text{'} + \text{'}1, \qquad (8)$$

etc.

Figure 8:
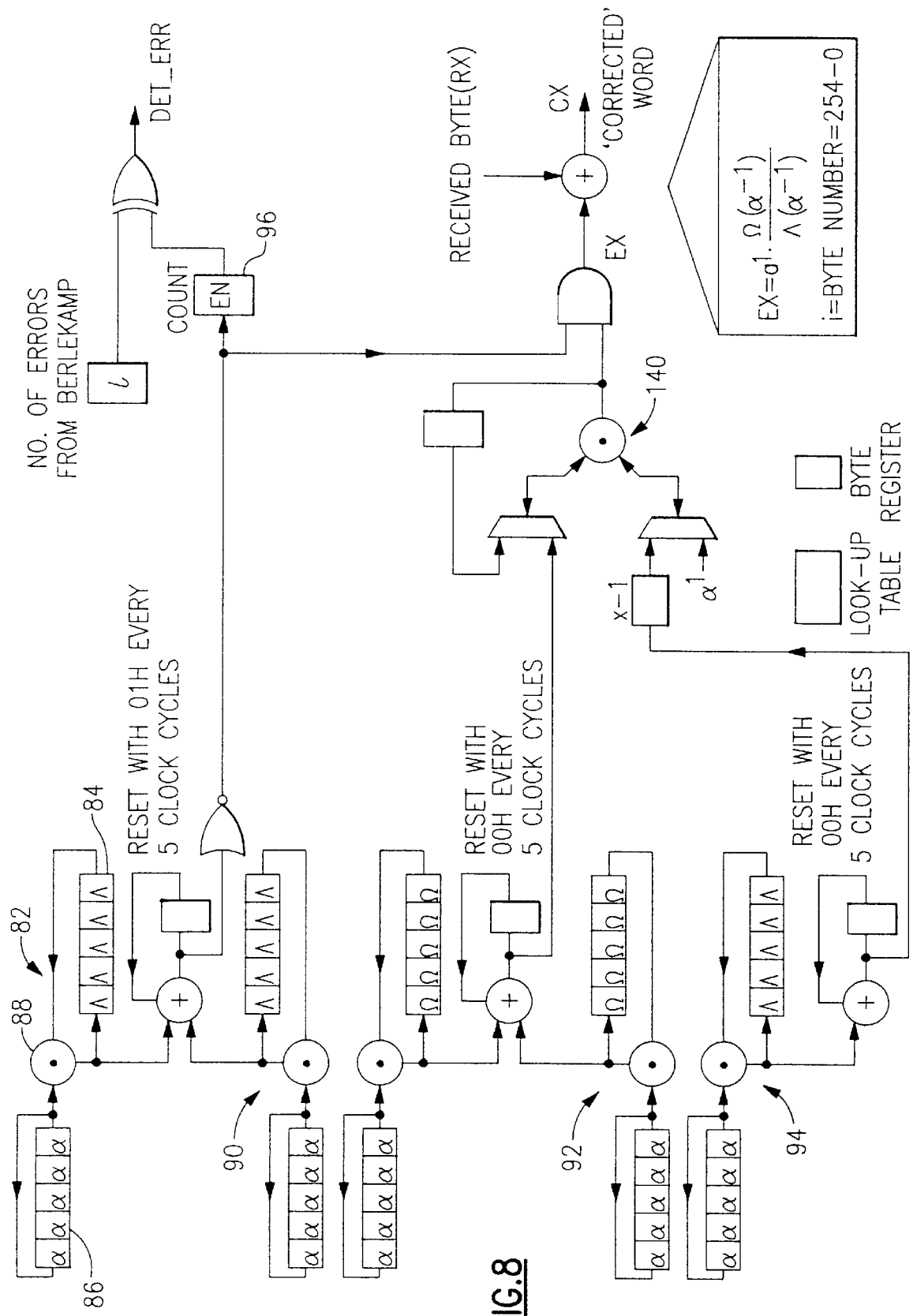
FIG. 8 shows a block diagram of the arrangement for accomplishing a Chien search in the decoder illustrated in FIG. 1.

The Chien Search Block 80 (FIG. 1) is shown in greater detail in FIG. 8. The terms of $\Lambda(x)$ are computed using two parallel units. The top unit 82, having a pair of shift registers 84, 86 feeding into a multiplier 88, concerns the coefficients $\alpha^1-\alpha^5$ will be discussed. The other units 90, 92, and 94 operate identically. The two top units 82, 90 in FIG. 8 are used to compute $\Lambda(x)$.

In each iteration the products are subjected to a rotate operation, so that they recycle through the shift registers. Thus In the sixth iteration the next location is being evaluated, and the rightmost cell of the shift register contains the product $\Lambda_5(\alpha^5)$. The product $\Lambda_5(\alpha^{10})$ is immediately required, and it is only now necessary to multiply the product of the first iteration by $\alpha^5$.

Counter 96 is incremented each time $\Lambda(x)=0$, in order to count the number of error locations found. There are two checks performed to determine if the received packet contained more than the maximum of 10 erroneous bytes. Firstly the value in the counter 96 is compared with the value in register 56 (FIG. 7). A difference between these two values indicates a packet having more than 10 errors. Secondly an error in bytes 254 - 208 found in the Chien search would invalidate the block. These are bytes not received, but only used to simplify the Chien Search block 80.

The equation used to calculate the magnitude of error is given by $$E(x) = \frac{\Omega(\alpha^{-i})}{\Lambda'(\alpha^{-i})} \alpha^i \qquad (9)$$

This result is only added to the received byte if the evaluation of $\Lambda(x)$ at that location equals zero. The evaluation of $\Omega(x)$ and $\Lambda'(x)$ is performed similarly to $\Lambda(x)$, using the lower two units 92, 94. Unit 94 produces $\Lambda'(x)$, and the reciprocal is obtained with a look-up table in a ROM (not shown).

Those skilled in the art will appreciate that in Galois Field arithmetic $$(a*b)=(\alpha^a*\alpha^b)=\alpha^{a+b} \qquad (10)$$

The actual value of $\alpha^{a+b}$ is determined by the field generator polynomial, for example the field generator polynomial given in equation 2. Furthermore, according to the distributive rule, if $$a=b+c \qquad (11)$$

then $$d \cdot a = d \cdot b + d \cdot c \qquad (12)$$

The function of the multiplier can be understood with reference to the following equations:

$$a(x)=a_7x^7+a_6x^6+a_5x^5+a_4x^4+a_3x^3+a_2x^2+a_1x^1+a_0 \qquad (13)$$

$$b(x)=b_7x^7+b_6x^6+b_5x^5+b_4x^4+b_3x^3+b_2x^2+b_1x^1+b_0 \qquad (14)$$

then $$a(x)*b(x)=c(x) \qquad (15)$$

where "*" indicates Galois Field multiplication.

$$c'_0=a_0b_0 \qquad (16)$$

$$c'_1=a_0b_1+a_1b_0 \qquad (17)$$

$$c'_1=a_0b_2+a_1b_1+a_2b_0 \qquad (18)$$

$$c'_{13}=a_6b_7+a_7b_6 \qquad (19)$$

$$c'_{14}=a_7b_7 \qquad (20)$$

With p(x) as in equation (2)

$$c_0=c'_0+c'_8+c'_{12}+c'_{13}+c'_{14} \qquad (21)$$

$$c_1=c'_1+c'_9+c'_{13}+c'_{14} \qquad (22)$$

$$c_2+c'_2+c'_8+c'_{10}+c'_{12}+c'_{13} \qquad (23)$$

etc.

A direct implementation of the above multiplication has been effected with a general multiplier in hardware. In some instances, the general multiplier takes the inputs from an associated alpha-generator. However a general multiplier requires considerable area on an integrated circuit. Because one of the multiplicands is known, substantial spatial economy can be achieved by replacing the general multiplier by a plurality of constant coefficient multipliers. In multiplicative operations such as are involved in the generation of a syndrome $S_j$ (equation 3), the multiplication in succeeding cycles to develop exemplary terms $rx_i\alpha^3$, $rx_i\alpha^4$, $rx_i\alpha^5$ can be performed by the multiplier structure 98 shown in FIG. 9. In the discussion which follows, r is simply a constant, not necessarily related to the ith byte in a packet of data. In this example the generation of only 3 terms is shown for clarity of presentation, it being understood that in practice many more terms may be calculated. The input to the multiplier structure 98 is the first multiplicand $rx_i$100, which is multiplied in a constant coefficient multiplier 102 by the alpha coefficient $\alpha^3$104. The product $rx_i\alpha^3$ appears at node 106, which becomes the input term to a succeeding constant coefficient multiplier 108. In generating the product $rx_i\alpha^4$ at node 110, the constant coefficient multiplier 108 takes advantage of the relationship $$\alpha^n=\alpha^1 \cdot \alpha^{n-1} \qquad (24)$$

The products are multiplexed in a multiplexer 112, and are typically added by an adder 114 to another value for further processing. Those skilled in the art will appreciate that the constant coefficient multiplier 108 can be implemented with as few as three exclusive-OR ("XOR") gates.

The inventors have discovered that by taking advantage of the distributive law of multiplication expressed in equation (12) and the fact that an alpha value can be expressed as the a linear combination of other alpha values, an economical, more conveniently structured; and more practical Galois Field multiplier can be implemented. Several representative alpha values are shown as binary numbers in Table 1.

TABLE 1

| alpha values of Galois field | binary value |
|---|---|
| $\alpha^0$ | 00000001 |
| $\alpha^1$ | 00000010 |
| $\alpha^2$ | 00000100 |
| $\alpha^3$ | 00001000 |
| $\alpha^4$ | 00010000 |
| $\alpha^8$ | 00011101 |

It will be noted that the alpha values can be added by modulo 2 addition without generating a carry bit. Thus, for example $$\alpha^8=\alpha^4+\alpha^3+\alpha^2+\alpha^0 \qquad (25)$$

Forming the product $\alpha^8*rx_i$, where "*" represents the multiplication operator in Galois Field arithmetic, can be done by inputting a second multiplicand $\alpha_8$, utilizing the distributive law of multiplication.

$$rx_i\alpha^8=rx_i\alpha^4+rx_i\alpha^3+rx_i\alpha^2+rx_i\alpha^0 \qquad (26)$$

Figure 9:
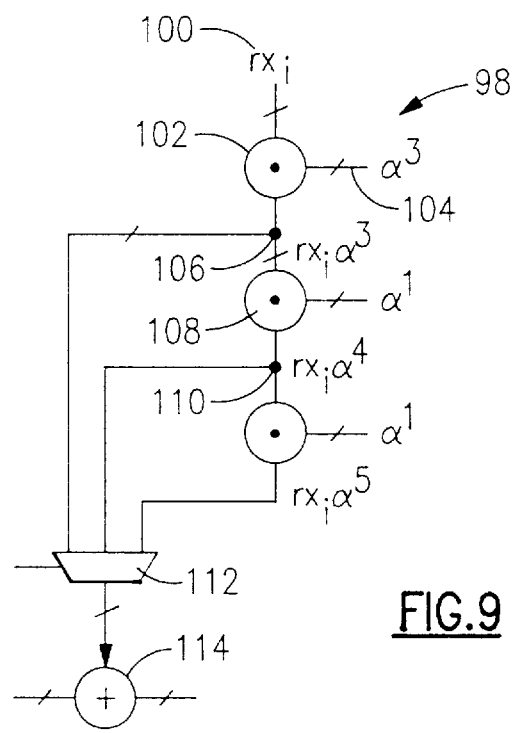
FIG. 9 is a schematic of a preferred embodiment of a Galois Field multiplier in accordance with the invention.
Figure 11:
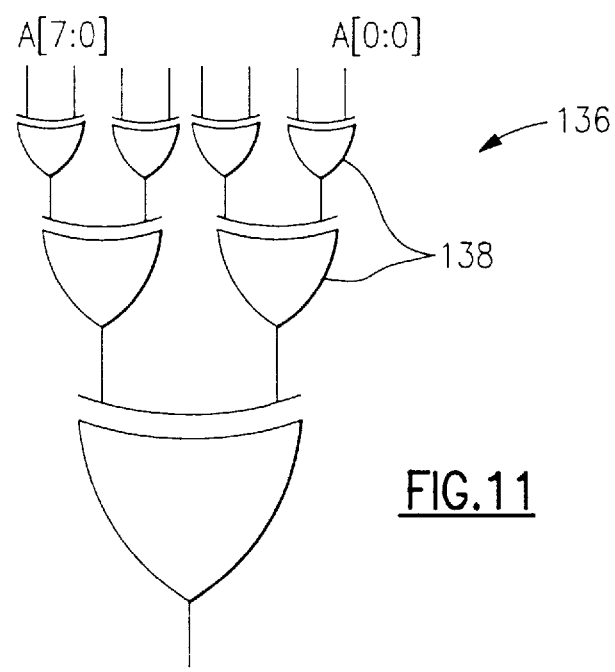
FIG. 11 is a more detailed schematic of an addition circuit which is found in the embodiments of FIGS. 9 and 10.
Figure 10:
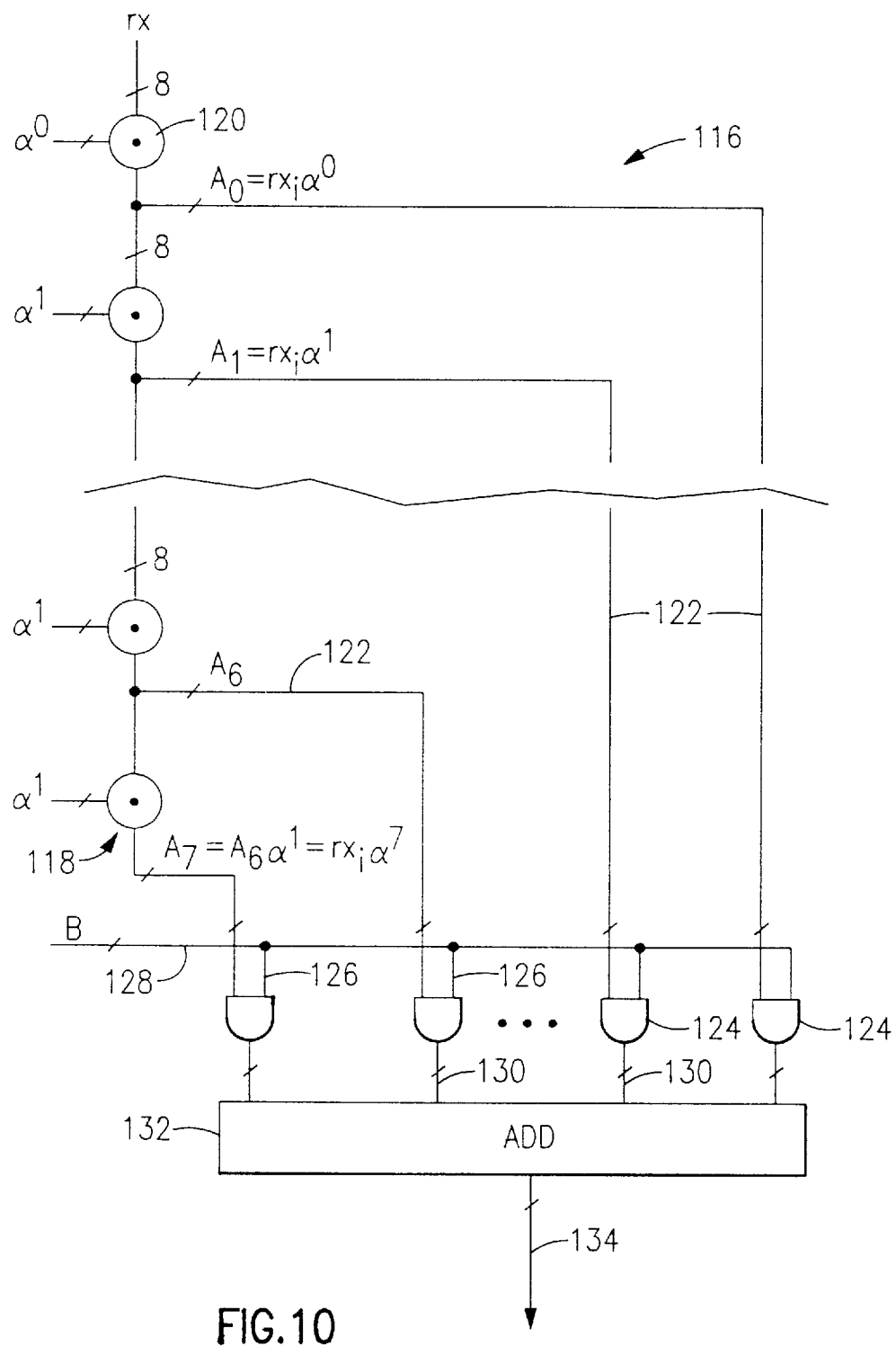
FIG. 10 is a schematic of another preferred embodiment of a Galois Field multiplier in accordance with the invention.

FIG. 10 illustrates a preferred embodiment of a Galois Field multiplier, which is generally referenced 116. An array of 8 constant coefficient multipliers 118 is arranged in the same manner as shown in FIG. 9. A data path of 8 bits is demonstrated; however the circuit can be constructed with other bus widths. It will be noted that in the special case where n=0, $\alpha^0$, the input to the first constant coefficient multiplier 120 is unity. In such an application the constant coefficient multiplier 120 can be eliminated. All the other multipliers in the array of constant coefficient multipliers 118 multiply by $\alpha^j$, with j=1 in the example of FIG. 9. The products formed by the array of constant coefficient multipliers 118 are conducted on buses 122 to the first inputs of a row of 8 selectors 124. The second inputs to the selectors 124 are respective bit lines 126 of the second multiplicand B which appears on a bus 128. The selectors 124 may be realized as a plurality of AND gates, wherein the bit lines of each bus 122 are enabled in common according to a respective bit line 126. In the present example, bits 0, 2, 3, and 4 of the bus 128 will be set, and the outputs of the selectors 124 on buses 130 can be represented as the sequence {0, 0, 0, A[4], A[3] A[2], 0, A[0]}. The elements of this sequence are summed in an adder block 132, and the sum appears on an output bus 134. As no carry is generated, the additions of each of the 8 elements are simply performed in modulo 2 addition in a logical network 136 arranged as trees of XOR gates 138. FIG. 11 illustrates one of the eight identical networks that are utilized in the adder block 132, wherein the logic is applied to the least significant bit of each of the buses 130. Other known adder circuits are also suitable in the adder block 132.

Initial hardware implementations of this embodiment have produced a 20% reduction in gate count, compared with straightforward implementations of the multiplication according to equations (13)–(20). Although the preceding embodiment has been discussed with respect to Reed-Solomon decoding, it is equally applicable to other (N, K) codes, and to "Bose, Ray-Chaudhuri, Hocquenghem" ("BCH") codes in general, and to other apparatus where Galois Field multiplication is performed.

Figure 2:
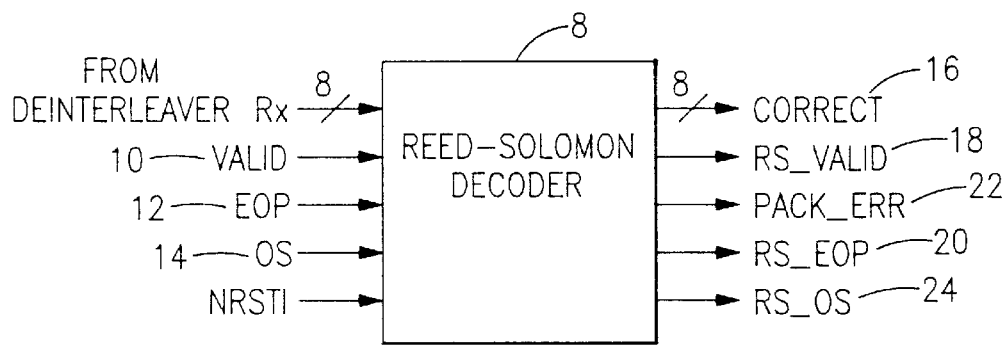
FIG. 2 is another block diagram of the Reed-Solomon decoder which operates according to the diagram of FIG. 1.
Figure 3:
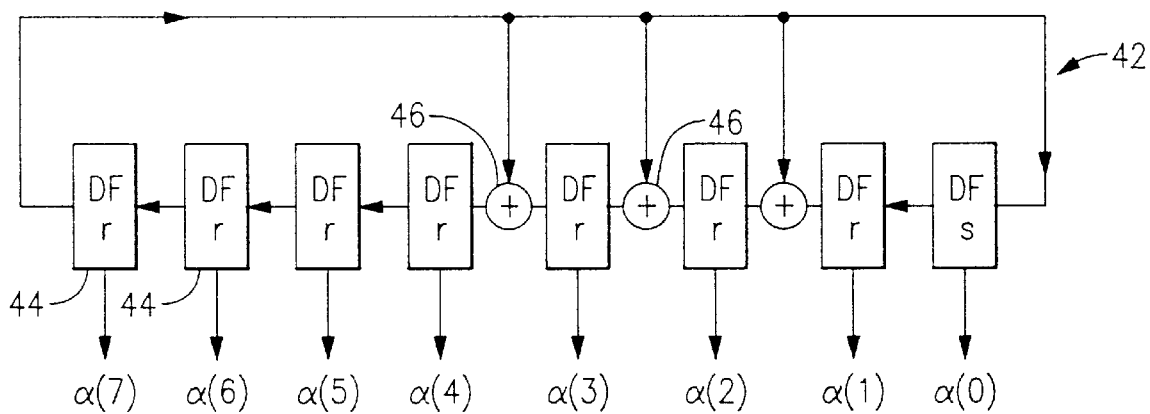
FIG. 3 is a schematic illustrating the generation of entries in a Galois Field.

The Galois Field multiplier 116 can be effectively used in the Chien Search block 80 (FIG. 8), as the general Galois Field multiplier 140 and throughout the decoder 8 (FIG. 2).

In the preferred embodiment, the decoder 8 and the Galois Field multiplier 116 are implemented in a VLSI circuit.

EXAMPLE

In this example a standard hardware description language conforming to IEEE Standard 1364-1995 was used to describe the hardware implementation.

First a conventional general Galois Field multiplier was developed, according to the following description:

```
module GFULL(X,Y,GFULL);
input [7:0] X;
input [7:0] Y;
output [7:0] GFULL;
reg [7:0] GFULL;
reg [7:0] A0B, A1B, A2B, A3B, A4B, A5B, A6B, A7B;
reg [14:0] C;
integer i;
always @(X or Y or GFULL)
begin
    for(i=0;i<8;i=i+1)
    begin
        A0B[i] = X[0] && Y[i];
        A1B[i] = X[1] && Y[i];
        A2B[i] = X[2] && Y[i];
        A3B[i] = X[3] && Y[i];
        A4B[i] = X[4] && Y[i];
        A5B[i] = X[5] && Y[i];
        A6B[i] = X[6] && Y[i];
        A7B[i] = X[7] && Y[i];
    end
    C[0]  = A0B[0];
    C[1]  = A0B[1]^A1B[0];
    C[2]  = A0B[2]^A1B[1]^A2B[0];
    C[3]  = A0B[3]^A1B[2]^A2B[1]^A3B[0];
    C[4]  = A0B[4]^A1B[3]^A2B[2]^A3B[1]^A4B[0];
    C[5]  = A0B[5]^A1B[4]^A2B[3]^A3B[2]^A4B[1]^A5B[0];
    C[6]  = A0B[6]^A1B[5]^A2B[4]^A3B[3]^A4B[2]^A5B[1]^A6B[0];
    C[7]  = A0B[7]^A1B[6]^A2B[5]^A3B[4]^A4B[3]^A5B[2]^A6B[1]^A7B[0];
    C[8]  =          A1B[7]^A2B[6]^A3B[5]^A4B[4]^A5B[3]^A6B[2]^A7B[1]^;
    C[9]  =                 A2B[7]^A3B[6]^A4B[5]^A5B[4]^A6B[3]^A7B[2]^;
    C[10] =                        A3B[7]^A4B[6]^A5B[5]^A6B[4]^A7B[3]^;
    C[11] =                               A4B[7]^A5B[6]^A6B[5]^A7B[4]^;
    C[12] =                                      A5B[7]^A6B[6]^A7B[5]^;
    C[13] =                                             A6B[7]^A7B[6]^;
    C[14] =                                                    A7B[7]^;
    GFULL[0] = C[0]^C[8]^C[12]^C[14]^C[14];
    GFULL[1] = C[1]^C[9]^C[13]^C[14];
    GFULL[2] = C[2]^C[8]^C[10]^C[12]^C[13];
    GFULL[3] = C[3]^C[8]^C[9]^C[11]^C[12];
    GFULL[4] = C[4]^C[8]^C[9]^C[10]^C[14];
    GFULL[5] = C[5]^C[9]^C[10]^C[11];
    GFULL[6] = C[6]^C[10]^C[11]^C[12];
    GFULL[7] = C[7]^C[11]^C[12]^C[13];
end
``` endmodule

Next the Galois Field multiplier 116 (FIG. 10) was described as follows:

```
module GFULL(X,Y,GFULL);
input [7:0] X;
input [7:0] Y;
output [7:0] GFULL;
reg [7:0] GFULL;
reg [7:0] A0, A1, A2, A3, A4, A5, A6, A7;
integer i;
always @(X or Y or GFULL)
begin
    A0 = X;
    A1 = {A0[6],A0[5],A0[4],A0[3]^A0[7],A0[2]^A0[7],A0[1]^A0[7],A0[0],A0[7]};
    A2 = {A1[6],A1[5],A1[4],A1[3]^A1[7],A1[2]^A1[7],A1[1]^A1[7],A1[0],A1[7]};
    A3 = {A2[6],A2[5],A2[4],A2[3]^A2[7],A2[2]^A2[7],A2[1]^A2[7],A2[0],A2[7]};
    A4 = {A3[6],A3[5],A3[4],A3[3]^A3[7],A3[2]^A3[7],A3[1]^A3[7],A3[0],A3[7]};
    A5 = {A4[6],A4[5],A4[4],A4[3]^A4[7],A4[2]^A4[7],A4[1]^A4[7],A4[0],A4[7]};
    A6 = {A5[6],A5[5],A5[4],A5[3]^A5[7],A5[2]^A5[7],A5[1]^A5[7],A5[0],A5[7]};
    A7 = {A6[6],A6[5],A6[4],A6[3]^A6[7],A6[2]^A6[7],A6[1]^A6[7],A6[0],A6[7]};
    for(i=0;i<8;i=i+1)
    begin
        A0[i] = A0[i] && Y[0];
        A1[i] = A1[i] && Y[1];
        A2[i] = A2[i] && Y[2];
        A3[i] = A3[i] && Y[3];
        A4[i] = A4[i] && Y[4];
        A5[i] = A5[i] && Y[5];
        A6[i] = A6[i] && Y[6];
        A7[i] = A7[i] && Y[7];
    end
    GFULL = A0^A1^A2^A3^A4^A5^A6^A7;
end
endmodule
```

The above modules were processed by a synthesis program, Compass ASICSyn (Trademark) which produced the following area reports for the conventional general Galois Field multiplier and the Galois Field multiplier 116 respectively:

```
##########################################################
#       AREA REPORT                                      #
##########################################################
#       cell "GFULL1"                                    #
# ===================================================== #
```

| Cell Name | Num Insts | Gate Eqv Per Cell | Tot Gate Equivs | Width Per Cell | Total Width |
|---|---|---|---|---|---|
| an02d0 | 13 | 1.5 | 19.5 | 8.0 | 104.0 |
| aoi22d1 | 25 | 2.0 | 50.0 | 10.0 | 250.0 |
| inv0d0 | 42 | .5 | 21.0 | 4.0 | 168.0 |
| nd02d0 | 51 | 1.0 | 51.0 | 6.0 | 306.0 |
| oai22d1 | 15 | 2.0 | 30.0 | 10.0 | 150.0 |
| xn02d1 | 4 | 3.5 | 14.0 | 16.0 | 64.0 |
| xr02d1 | 75 | 3.5 | 262.5 | 14.0 | 1050.0 |
| Totals: | 225 | | 448.0 | | 2092.0 |
| Initial: | | | (508.5) | | (3226.0) |

Total pins: 737
Total nets: 241
Average pins per net: 3.1; Max pins per net: 9 (excluding power and ground nets

```
##########################################################
#       AREA REPORT                                      #
##########################################################
#       cell "GFULL2"                                    #
# ===================================================== #
```

| Cell Name | Num Insts | Gate Eqv Per Cell | Tot Gate Equivs | Width Per Cell | Total Width |
|---|---|---|---|---|---|
| an02d0 | 28 | 1.5 | 42.0 | 8.0 | 224.0 |
| aoi22d1 | 2 | 2.0 | 4.0 | 10.0 | 20.0 |
| inv0d0 | 21 | 0.5 | 10.5 | 4.0 | 84.0 |
| mx02d0 | 10 | 3.0 | 30.0 | 12.0 | 120.0 |
| nd02d0 | 30 | 1.0 | 30.0 | 6.0 | 180.0 |
| oai221d1 | 6 | 2.5 | 15.0 | 12.0 | 72.0 |
| oai22d1 | 3 | 2.0 | 6.0 | 10.0 | 30.0 |
| xr02d1 | 67 | 3.5 | 234.5 | 14.0 | 938.0 |
| Totals: | 167 | | 372.0 | | 1668.0 |
| Initial: | | | (431.5) | | (2796.0) |

Total pins: 542
Total nets: 183
Average pins per net: 3.0; Max pins per net: 13 (excluding power and ground nets While this invention has been explained with reference to the structure disclosed herein, it is not confined to the details set forth and this application is intended to cover any modifications and changes as may come within the scope of the following claims:

What is claimed is:

1. A decoder for an electromagnetic signal that is encoded according to a BCH code, wherein the code is specified by a generator polynomial $g(x)$ and has a primitive element $\alpha$, the decoder being of a type which operates on a term $x_i \alpha^j$, wherein the improvement comprises:

a circuit for forming a product A*B where "*" is a Galois Field multiplication operator, comprising:

a linear sequence of multipliers having a first multiplier and an immediately succeeding second multiplier, a first input of said first multiplier defining a first multiplicand, and a second input of said first multiplier defining a second multiplicand, said second multiplicand being a constant $\alpha^k$; wherein an output of said first multiplier is connected to a first input of said second multiplier;

a first selector connected to said output of said first multiplier;

a second selector connected to said output of said second multiplier, said first and second selectors having select lines that are set according to a representation of a magnitude B; and an addition circuit connected to outputs of said selectors for adding selected outputs of said multipliers.

2. The decoder according to claim 1, wherein said multipliers comprise constant coefficient multipliers.

3. The decoder according to claim 1, wherein said addition circuit performs addition without carry.

4. The decoder according to claim 3, wherein said addition circuit comprises a logical network of XOR gates.

5. In an integrated circuit, a decoder for an electromagnetic signal that is encoded according to a BCH code, wherein the code is specified by a generator polynomial g(x) and has a primitive element $\alpha$, the decoder being of a type which operates on a term $x_i\alpha^j$, wherein the improvement comprises:

a circuit for forming a product A*B where "*" is a Galois Field multiplication operator, comprising:

a linear sequence of constant coefficient multipliers having a first multiplier and an immediately succeeding second multiplier, a first input of said first multiplier defining a first multiplicand, and a second input of said first multiplier defining a second multiplicand, said second multiplicand being a constant $\alpha^k$; wherein an output of said first multiplier is connected to a first input of said second multiplier, wherein said first multiplicand and said second multiplicand is a term A of said product A*B;

first and second bit lines having signals thereon according to a binary representation of a term B of said product A*B;

a first logical element having a first input connected to said output of said first multiplier and a second input connected to said first bit line;

a second logical element having a first input connected to said output of said second multiplier and a second input connected to said second bit line; and a logical network for performing modulo 2 arithmetic; and having a first input connected to an output of said first logical element and a second input connected to said second logical element.

6. A decoder for an electromagnetic signal encoded according to a BCH code that is specified by a generator polynomial g(x) and has a primitive element $\alpha$, the decoder being of a type which operates on a term $x_i\alpha^j$, wherein the improvement comprises a Galois Field multiplier comprising:

a linear array of constant coefficient multipliers, an input of a said constant coefficient multiplier of said plurality defining a first multiplicand A, and a second multiplicand of said constant coefficient multiplier being a constant $\alpha^k$; wherein an output of said constant coefficient multiplier is connected to the input of a succeeding constant coefficient multiplier;

a plurality of bit lines having states that form a binary representation of a magnitude B;

a plurality of switches, each said switch being connected to the output of a respective one of said constant coefficient multipliers, and having a control line connected to a respective one of said bit lines; and an addition circuit for performing modulo 2 addition connected to said switches for summing the outputs of said constant coefficient multipliers, whereby said summed outputs are output as a binary representation of a magnitude A*B, where "*" is a Galois Field multiplication operator.

7. The decoder according to claim 6, wherein said addition circuit comprises a logical network.

8. A decoder for an electromagnetic signal encoded according to a Reed-Solomon code that is specified by a generator polynomial g(x) and has a primitive element $\alpha$, the decoder being of a type which operates on a term $x_i\alpha^j$, wherein the improvement comprises: a circuit for forming a product A*B where "*" is a Galois Field multiplication operator, the circuit comprising:

a linear chain of constant coefficient multipliers, an input of a first said multiplier in said chain defining a first multiplicand A, and a second multiplicand of said multiplier being a constant $\alpha^k$; wherein an output of said multiplier is connected to the input of succeeding multiplier;

a plurality of AND gates having first inputs connected to outputs of said multipliers for enabling the output thereof, said gates each having second inputs connected to a bus, wherein a binary representation of a magnitude B appears on said bus; and an addition circuit connected to said selectors for summing said enabled outputs of said multipliers.

9. The decoder according to claim 8, wherein said addition circuit comprises a logical network of XOR gates arranged as a tree for performing modulo 2 addition.

10. A method of performing Reed-Solomon decoding, wherein $\alpha$ is a primitive element in a Reed-Solomon code, comprising the steps of:

providing a VLSI circuit having a Reed-Solomon decoder therein; and performing Galois Field multiplication in said circuit to obtain a product $x_i\alpha^j$ by the steps of:

identifying a linear combination of values $\alpha^n$ having a sum equal to a where for each value $\alpha^n$, n is an integer;

generating each value $\alpha^n$ by multiplying $\alpha^n$ by $\alpha^{n-k}$, where k is an integer;

multiplying each value $\alpha^n$ by $x_i$; to yield products $\alpha^n x_i$; and summing the products $\alpha^n x_i$.

* * * * *